United States Patent [19]

Ballance et al.

[11] Patent Number: 5,441,765
[45] Date of Patent: Aug. 15, 1995

[54] METHOD OF FORMING SI-O CONTAINING COATINGS

[75] Inventors: David S. Ballance; Robert C. Camilletti; Diana K. Dunn, all of Midland, Mich.

[73] Assignee: Dow Corning Corporation, Midland, Mich.

[21] Appl. No.: 124,529

[22] Filed: Sep. 22, 1993

[51] Int. Cl.⁶ .............................................. B05D 3/02
[52] U.S. Cl. .................................... 427/228; 427/377; 427/387; 427/397.7; 427/579; 428/688; 437/238
[58] Field of Search ............... 427/228, 387, 226, 377, 427/397.7, 579; 428/688; 437/238

[56] References Cited

U.S. PATENT DOCUMENTS 4,756,977  7/1988  Haluska et al. ...................... 428/704
5,320,868  6/1994  Ballance et al. ...................... 427/228

FOREIGN PATENT DOCUMENTS 0427395  5/1991  European Pat. Off. .

Primary Examiner—Michael Lusignan
Attorney, Agent, or Firm—Roger E. Gobrogge

[57] ABSTRACT

Disclosed is a method for forming improved Si—O containing coatings on electronic substrate. The method comprises treating Si—O containing ceramic coatings derived from hydrogen silsesquioxane resin with hydrogen gas. The resultant coatings have improved properties such as stable dielectric constants.

12 Claims, No Drawings

METHOD OF FORMING SI-O CONTAINING COATINGS

BACKGROUND

The present invention relates to a method of forming novel Si—0 containing coatings. The method comprises treating Si—0 containing ceramic coatings derived from hydrogen silsesquioxane resin with hydrogen gas. The resultant coatings have desirable properties.

The use of silica-containing ceramic coatings derived from hydrogen silsesquioxane resin on electronic devices is known in the art. For instance, Haluska et al. in U.S. Pat. No. 4,756,977 describe processes for forming coatings on electronic devices which comprise diluting hydrogen silsesquioxane in solvents, applying the solutions to substrates, evaporating the solvents and heating the coated substrates to a temperature of about 150° to about 1000° C. in air. This patent, however, does not describe annealing the coatings with hydrogen gas.

The conversion of hydrogen silsesquioxane resin to a Si—0 containing ceramic in other environments is also known in the art. For instance, European Patent Application No. 90311008.8 teaches the conversion of hydrogen silsesquioxane resin to a Si—0 containing ceramic by heating a substrate coated with the resin in an inert gas atmosphere. This patent too, however, does not describe annealing the coatings with hydrogen gas.

The present inventor has now discovered that when Si—0 containing coatings derived from hydrogen silsesquioxane resin are treated with hydrogen gas, the properties of the coating are improved.

SUMMARY OF THE INVENTION

The present invention relates to a method of forming an Si—0 containing coating on an electronic substrate. The method comprises first applying a coating comprising hydrogen silsesquioxane resin on an electronic substrate. The coated electronic substrate is then heated to a temperature sufficient to convert the hydrogen silsesquioxane resin to an Si—O containing ceramic coating. The Si—O containing ceramic coating is then exposed to an atmosphere containing hydrogen gas for a time and at a temperature sufficient to anneal the coating.

The present invention also relates to Si—O containing ceramic coatings having a dielectric constant less than or equal to about 3.2.

DETAILED DESCRIPTION OF THE INVENTION

The present invention is based on the unexpected discovery that annealing Si—O containing ceramic coatings derived from hydrogen silsesquioxane resin with hydrogen gas improves the properties of the coatings. For instance, such an anneal can lower the dielectric constant of the coating and render it stable. Moreover, such treatment may also advantageously affect the physical properties of the coating (eg., moisture absorption, cracking, etc.). These effects were particularly unexpected since it was not known how hydrogen gas would affect the coatings and since coatings having the resultant properties are not known in the art.

Because of these effects, the coatings resulting from this invention are particularly valuable on electronic substrates. Such coatings could serve, for example, as protective coatings, interlevel dielectric layers, doped dielectric layers to produce transistor like devices, pigment loaded binder systems containing silicon to produce capacitor and capacitor like devices, multilayer devices, 3-D devices, silicon on insulator devices, coatings for superconductors, super lattice devices and the like.

As used in the present invention, the expression "ceramic" is used to describe the hard, Si—O containing coatings obtained after heating hydrogen silsesquioxane resin. These coatings may contain both silica ($SiO_2$) materials as well as silica-like materials (eg., $SiO$, $Si_2O_3$, etc.) which are not fully free of residual carbon, silanol (Si—OH) and/or hydrogen. The coatings may also be doped with boron or phosphorous. The expression "electronic substrate" is meant to include, but is not limited to, electronic devices or electronic circuits such as silicon based devices, gallium arsenide based devices, focal plane arrays, opto-electronic devices, photovoltaic cells and optical devices.

According to the process of the invention, a coating comprising hydrogen silsesquioxane resin is first applied on an electronic substrate. The hydrogen silsesquioxane resins (H-resin) which may be used in this process include hydridosiloxane resins of the formula $HSi(OH)_x(OR)_yO_{z/2}$, in which each R is independently an organic group or a substituted organic group which, when bonded to silicon through the oxygen atom, forms a hydrolyzable substituent, $x=0-2$, $y=0-2$, $z=1-3$, $x+y+z=3$. Examples of R include alkyls such as methyl, ethyl, propyl, butyl, etc., aryls such as phenyl, and alkenyls such as allyl or vinyl. These resins may be fully condensed $(HSiO_{3/2})_n$ or they may be only partially hydrolyzed (i.e., containing some Si—OR) and/or partially condensed (i.e., containing some Si—OH). Although not represented by this structure, these resins may also contain a small number (eg., less than about 10%) of silicon atoms which have either 0 or 2 hydrogen atoms attached thereto or a small number of SiC bonds due to various factors involved in their formation or handling. Additionally, the resin may also be doped with boron or phosphorous if desired.

The above H-resins and methods for their production are known in the art. For example, Collins et al. in U.S. Pat. No. 3,615,272, which is incorporated herein by reference, teach the production of a nearly fully condensed H-resin (which may contain up to 100-300 ppm silanol) by a process comprising hydrolyzing trichlorosilane in a benzenesulfonic acid hydrate hydrolysis medium and then washing the resultant resin with water or aqueous sulfuric acid. Similarly, Bank et al. in U.S. Pat. No. 5,010,159, which is hereby incorporated by reference, teach an alternative method comprising hydrolyzing hydridosilanes in an arylsulfonic acid hydrate hydrolysis medium to form a resin which is then contacted with a neutralizing agent.

Other hydridosiloxane resins, such as those described by Frye et al. in U.S. Pat. No. 4,999,397, hereby incorporated by reference, those produced by hydrolyzing an alkoxy or acyloxy silane in an acidic, alcoholic hydrolysis medium, those described in Kokai Patent Nos. 59-178749, 60-86017 and 63-107122, or any other equivalent hydridosiloxane, will also function herein.

It is to be noted that in a preferred embodiment of the invention, specific molecular weight fractions of the above H-resins may also be used in this process. Such fractions and methods for their preparation are taught by Hanneman et al. in U.S. Pat. 5,063,267 which is hereby incorporated by reference. A preferred fraction comprises material wherein at least 75% of the polymeric species have a molecular weight above about 1200 and a more preferred fraction comprises material wherein at least 75% of the polymeric species have a molecular weight between about 1200 and about 100,000.

The hydrogen silsesquioxane resin coating material may also contain other ceramic oxide precursors. Examples of such ceramic oxide precursors include compounds of various metals such as aluminum, titanium, zirconium, tantalum, niobium and/or vanadium as well as various non-metallic compounds such as those of boron or phosphorous which may be dissolved in solution, hydrolyzed, and subsequently pyrolyzed, at relatively low temperatures and relatively rapid reaction rates to form ceramic oxide coatings.

The above ceramic oxide precursor compounds generally have one or more hydrolyzable groups bonded to the above metal or non-metal, depending on the valence of the metal. The number of hydrolyzable groups to be included in these compounds is not critical as long as the compound is soluble in the solvent. Likewise, selection of the exact hydrolyzable substituent is not critical since the substituents are either hydrolyzed or pyrolyzed out of the system. Typical hydrolyzable groups include, but are not limited to, alkoxy, such as methoxy, propoxy, butoxy and hexoxy, acyloxy, such as acetoxy, or other organic groups bonded to said metal or non-metal through an oxygen such as acetylacetonate. Specific compounds, therefore, include zirconium tetracetylacetonate, titanium dibutoxy diacetylacetonate, aluminum triacetylacetonate, tetraisobutoxy titanium, $B_3(OCH_3)_3O_3$ and $P_3(OCH_2CH_3)_3O$.

When hydrogen silsesquioxane resin is to be combined with one of the above ceramic oxide precursors, generally it is used in an amount such that the final ceramic coating contains 70 to 99.9 percent by weight $SiO_2$.

The hydrogen silsesquioxane resin coating material may also contain a platinum, rhodium or copper catalyst to increase the rate and extent of conversion to silica. Generally, any platinum, rhodium or copper compound or complex which can be solubilized will be functional. For instance, a composition such as platinum acetylacetonate, rhodium catalyst $RhCl_3[S(CH_2CH_2CH_2CH_3)_2]_3$, obtained from Dow Corning Corporation, Midland, Mich., or cupric naphthenate are all within the scope of this invention. These catalysts are generally added in an amount of between about 5 to 1000 ppm platinum, rhodium or copper based on the weight of hydrogen silsesquioxane resin.

The H-resin is coated on the desired substrate by any practical means but a preferred approach uses a solution comprising the H-resin in a suitable solvent. If this solution approach is used, the solution is generally formed by simply dissolving or suspending the H-resin in a solvent or mixture of solvents. Various facilitating measures such as stirring and/or heat may be used to assist in the dissolution. The solvents which may be used in this method include, for example, alcohols such as ethyl or isopropyl, aromatic hydrocarbons such as benzene or toluene, alkanes such as n-heptane or dodecane, ketones, cyclic dimethylpolysiloxanes, esters or glycol ethers, in an amount sufficient to dissolve the above materials to low solids. For instance, enough of the above solvent can be included to form a 0.1-50 weight percent solution.

The above H-resin solution is then applied to the substrate. Means such as spin, spray, dip or flow coating will all function herein. Following application, the solvent is allowed to evaporate by means such as simple air drying by exposure to an ambient environment or by the application of a vacuum or mild heat.

Although the above described methods primarily focus on using a solution approach, one skilled in the art would recognize that other equivalent means of coating (eg., melt coating) would also function herein and are contemplated to be within the scope of this invention.

The coated electronic substrate is then heated to a temperature sufficient to convert the hydrogen silsesquioxane resin to an Si—O containing ceramic coating. The temperature used for heating is generally in the range of about 50° to about 1000° C. The exact temperature, however, will depend on factors such as the pyrolysis atmosphere, heating time and the desired coating. Preferred temperatures are often in the range of about 200° to about 600° C.

Heating is generally conducted for a time sufficient to form the desired Si—O containing ceramic coating. Generally, the heating time is in the range of up to about 6 hours. Heating times of less than about 2 hours (eg., 0.1-2 hrs) are generally preferred.

The above heating may be conducted at any effective atmospheric pressure from vacuum to superatmospheric and under any effective oxidizing or non-oxidizing gaseous environment such as those comprising air, $O_2$, oxygen plasma, ozone, an inert gas ($N_2$, etc.), ammonia, amines, moisture, $N_2O$, etc.

Any method of heating such as the use of a convection oven, rapid thermal processing, hot plate, or radiant or microwave energy is generally functional herein. The rate of heating, moreover, is also not critical, but it is most practical and preferred to heat as rapidly as possible.

The Si—O containing ceramic coating is then exposed to an atmosphere containing hydrogen gas for a time and at a temperature sufficient to anneal the coating (i.e., a forming gas anneal). This exposure can occur immediately after formation of the ceramic coating or, alternatively, the exposure can be at any later time. Generally, this exposure is accomplished by introducing the desired hydrogen gas into a chamber or furnace used for the anneal.

The hydrogen gas used herein can be in any concentration practical. For example, concentrations in the range of between about 0.01 and 100 volume percent can be used. Obviously, however, the upper limit of the concentration will be determined by the method of use due to the explosive nature of hydrogen. Generally, preferred concentrations are in the range of about 1 to about 30 volume percent. If the hydrogen gas is to be in contact with air, generally concentrations of 5 volume percent or lower are used.

The diluent gas for the hydrogen is likewise not critical. Inert gases such a nitrogen, argon, helium, etc. or reactive gases such as air may all be used. As noted above, however, if a reactive gas is used, the concentration of hydrogen must be carefully monitored to prevent explosions.

The temperature used during hydrogen gas exposure can also vary over a wide range. Temperatures of from about room temperature up to about 800° C. are all functional herein. Preferred temperatures are generally in the range of between about 200° and about 600° C.

The time for exposure to the hydrogen gas can also vary over a wide range. Exposure times in the range of minutes to several hours (eg., 1 minute up to 4 hours)

are functional herein. Preferred exposure times are in the range of between about 10 minutes and 2 hours.

Although not wishing to be bound by theory, the present inventor postulates that the hydrogen gas exposure removes moisture from the coating and treats the coating so as to prevent reentry of said moisture. In this manner, the dielectric constant of the coating is lowered (eg., to the range of 2.8–4.5) and stabilized. Of particular interest is the fact that the resultant coatings can have dielectric constants less than 3.5, often less than 3.2, occasionally less than 3.0 and sometimes less than 2.8 at 1 MHz (eg., 2.7–3.2).

The following non-limiting examples are included so that one skilled in the art may more readily understand the invention.

EXAMPLE 1

Hydrogen silsesquioxane resin (made by the method of Collins et al. in U.S. Pat. No. 3,615,272) was diluted to 18 wt % in methylisobutylketone. 4 inch diameter 1 mOhm-cm, n-type, silicon wafers were coated with this solution by spinning at 3000 RPM for 10 seconds. The coated wafers were then converted to the Si—O containing ceramics in the manner specified in Tables 1–3. The resultant coatings were about 0.3 microns thick. After conversion to the ceramic, sample 2 was exposed to hydrogen gas (5 volume percent in nitrogen) at 400° C. for 20 minutes. Table 1 shows the effect of hydrogen gas on resistivity; Table 2 shows the effect of hydrogen gas on dielectric constant; and Table 3 shows the effect of hydrogen gas on mobile charge.

As is evident, exposing the coatings to hydrogen gas has a dramatic effect on their electrical properties. Moreover, as shown in Table 4, the dielectric constant of the coatings treated with hydrogen gas remain stable upon exposure to the laboratory ambient over time whereas the dielectric constant of the untreated coatings increase upon exposure to the laboratory ambient over time.

TABLE 1

| | Resistivity and Defect Density (Mean values, 2 iterations, 2 sigma) | | |
|---|---|---|---|
| No | Conversion Conditions | Resistivity (Ohm-cm) | Defects/cm$^2$ |
| 1 | 400° C. in N$_2$ for 1 hour | $1.31 \times 10^{13}$ | 1.86 |
| 2* | 400° C. in N$_2$ for 1 hour | $8.04 \times 10^{11}$ | 3.98 |
| 3 | 400° C. in O$_2$ for 1 hour | $6.16 \times 10^{13}$ | 0.71 |

TABLE 2

| | 1 MHz Dielectric Constant and Loss (Mean values, 2 iterations, 2 sigma) | | |
|---|---|---|---|
| No | Conversion Conditions | Dielectric Constant | Loss |
| 1 | 400° C. in N$_2$ for 1 hour | 3.907 | 0.0156 |
| 2* | 400° C. in N$_2$ for 1 hour | 2.968 | 0.0024 |
| 3 | 400° C. in O$_2$ for 1 hour | 3.552 | 0.0161 |

TABLE 3

| | Mobile Charge | |
|---|---|---|
| No | Conversion Conditions | Mobile Charge |
| 1 | 400° C. in N$_2$ for 1 hour | $1.2 \times 10^{12}$ |
| 2* | 400° C. in N$_2$ for 1 hour | $1.7 \times 10^{12}$ |
| 3 | 400° C. in O$_2$ for 1 hour | $2.0 \times 10^{12}$ |

*Exposure to hydrogen gas

TABLE 4

| | Dielectric Constant Over Time | | |
|---|---|---|---|
| No | DK at Formation | DK after 1 Day | DK after 160 Days |
| 1 | 3.907 | 3.874 | 4.081 |
| 2 | 2.968 | 2.973 | 2.773 |

EXAMPLE 2

Hydrogen silsesquioxane resin (made by the method of Collins et al. in U.S. Pat. No. 3,615,272) was diluted to 22 wt % in methylisobutylketone. 4 inch diameter 1 mOhm-cm, n-type, silicon wafers were coated with this solution by spinning at 1500 RPM for 10 seconds. One of the coated wafers was then converted to the Si—O containing ceramics by heating at 400° C. in nitrogen for 1 hour. The resultant coating was about 0.8 microns thick. The dielectric constant was 5.8. The coated wafer was then exposed to hydrogen gas (5 volume percent in nitrogen) at 400° C. for 20 minutes. The dielectric constant was decreased to 3.8.

A second coated wafer was then converted to the Si—O containing ceramics by heating at 400° C. in oxygen for 1 hour. The resultant coating was about 0.8 microns thick. The dielectric constant was 5.0. The coated wafer was then exposed to hydrogen gas (5 volume percent in nitrogen) at 400° C. for 20 minutes. The dielectric constant was decreased to 4.2.

As is evident, exposure to hydrogen gas has a significant effect on the dielectric constant.

That which is claimed is:

1. A method of forming an Si—O containing coating on an electronic substrate comprising:
    applying a coating comprising hydrogen silsesquioxane resin on an electronic substrate;
    heating the coated electronic substrate to a temperature sufficient to convert the hydrogen silsesquioxane resin to an Si—O containing ceramic coating; and
    exposing the Si—0 containing ceramic coating to an annealing atmosphere containing hydrogen gas for a time and at a temperature sufficient to anneal the coating.

2. The method of claim 1 wherein the hydrogen silsesquioxane resin is applied to the substrate by a process which comprises coating the substrate with a solution comprising a solvent and the hydrogen silsesquioxane resin and then evaporating the solvent.

3. The method of claim 1 wherein the coated substrate is converted to the Si—O containing ceramic coating by heating at a temperature in the range of between about 50° C. and about 1000° C. for less than about 6 hours.

4. The method of claim 1 wherein the hydrogen silsesquioxane resin is fractionated into polymeric species such that at least 75% of the polymeric species have a molecular weight between about 1200 and about 100,000.

5. The method of claim 1 wherein the hydrogen silsesquioxane resin containing coating also contains modifying ceramic oxide precursors comprising a compound containing an element selected from the group consisting of titanium, zirconium, aluminum, tantalum, vanadium, niobium, boron and phosphorous wherein the compound contains at least one hydrolyzable substituent selected from the group consisting of alkoxy or acyloxy and the compound is present in an amount such that the silica coating contains 0.1 to 30 percent by weight modifying ceramic oxide.

6. The method of claim 1 wherein the hydrogen silsesquioxane resin containing coating also contains a platinum, rhodium or copper catalyst in an amount of between about 5 and about 500 ppm platinum, rhodium or copper based on the weight of hydrogen silsesquioxane resin.

7. The method of claim 1 wherein the coated substrate is converted to the Si—O containing ceramic coating by heating in an atmosphere selected from the group consisting of air, $O_2$, oxygen plasma, ozone, an inert gas, ammonia, amines, moisture, and $N_2O$.

8. The method of claim 1 wherein the annealing atmosphere contains hydrogen gas in a concentration in the range of about 1 to about 30 volume percent.

9. The method of claim 1 wherein the annealing atmosphere contains hydrogen gas in a concentration of less than or equal to about 5 volume percent.

10. The method of claim 1 wherein the Si—O containing ceramic coating is exposed to the annealing atmosphere at a temperature in the range of between about 200 and about 600° C.

11. The method of claim 1 wherein the Si—O containing ceramic coating is exposed to the annealing atmosphere for a time in the range of between about 10 minutes and 2 hours.

12. In a method of stabilizing the dielectric constant of an Si—O containing ceramic coating derived from hydrogen silsesquioxane resin, the improvement comprises:

exposing an Si—O containing ceramic coating derived from hydrogen silsesquioxane resin to an atmosphere containing hydrogen gas for a time and at a temperature sufficient to stabilize the dielectric constant of the coating.

* * * * *